United States Patent [19]

Partin et al.

[11] Patent Number: 5,491,461
[45] Date of Patent: Feb. 13, 1996

[54] MAGNETIC FIELD SENSOR ON ELEMENTAL SEMICONDUCTOR SUBSTRATE WITH ELECTRIC FIELD REDUCTION MEANS

[75] Inventors: Dale L. Partin, Ray; Joseph P. Heremans, Troy; Louis Green, Rochester Hills, all of Mich.

[73] Assignee: General Motors Corporation, Detroit, Mich.

[21] Appl. No.: 239,772

[22] Filed: May 9, 1994

[51] Int. Cl.$^6$ .................................................. H01L 43/00
[52] U.S. Cl. ................ 338/32 R; 338/32 H; 324/207.21
[58] Field of Search ............................ 338/32 R, 32 H; 324/207.21, 252

[56] References Cited

U.S. PATENT DOCUMENTS

| | | | |
|---|---|---|---|
| 4,401,966 | 8/1983 | Ohmura et al. | 338/32 R |
| 4,568,905 | 2/1986 | Suzuki et al. | 338/32 H |
| 4,926,122 | 5/1990 | Schroeder et al. | 324/207.13 |
| 4,926,154 | 5/1990 | Heremans et al. | 338/32 R |
| 4,926,226 | 5/1990 | Heremans et al. | 357/27 |
| 4,939,456 | 7/1990 | Morelli et al. | 324/207.21 |
| 4,978,938 | 12/1990 | Partin et al. | 338/32 R |
| 5,038,131 | 8/1991 | Olk et al. | 338/32 R |
| 5,153,557 | 10/1992 | Partin et al. | 338/32 R |
| 5,184,106 | 2/1993 | Partin et al. | 338/32 R |
| 5,314,547 | 5/1994 | Heremans et al. | 338/32 R X |

OTHER PUBLICATIONS

H. P. Baltes & R. J. Popovic, *Proceedings* IEEE, 74, p. 1107 (1986) (pp. 1107–1132).
O. Madelung, *Semiconductors*, Landolt–Bornstein New Series, 17, Springer–Verlag, Berlin, p. 623 (1982).
M. J. Jou, Y. T. Cherng & G. B. Stringfellow, *J. Appl. Phys.*, 64, 1472 (1988) (pp. 1472–1475).
T. S. Rao, J. B. Webb, D. C. Houghton, J. M. Barbeau, W. T. Moore & J. P. Noad, *Appl. Phys. Letters*, 53, p. 51 (1988) (pp. 51–53).
G. J. Bougnot, A. F. Foucaran, M. Marjan, D. Etienne, J. Bougnot, F. M. H. DeLunnoy, & F. M. Roumanille, *J. Crystal Growth*, 77, p. 400 (1986) (pp. 400–407).
V. P. Gnezidolov, D. J. Lockwood & J. B. Webb, "Resonant Raman Scattering in InSb/In$_{1-x}$Al$_x$Sb Superlattices", *Phys. Rev.*, 48, or 11, pp. 8442–8445 (15 Sep. 1993).
W. Dobbelaere, J. DeBoeck & G. Borghs, *Appl. Phys. Lett.*, 55, p. 1856 (1989) (pp. 1856–1858).
D. L. Partin, J. Heremans & C. M. Thrush, "Growth and Characterization of Indium Antimonide Doped with Lead Telluride", *J. Appl. Phys.*, V 71, n5, pp. 2328–2332 (1 Mar. 1992).
P. N. Uppal, D. M. Gill, S. P. Svensson & D. C. Cooke, "Transport Properties of Hetero Structures Based on GaSb, InAs & InSb on GaAs Substrates", *J. Crystal Growth*, V 111, pp. 623–627 (1991).
J. Heremans, "Solid State Magnetic Field Sensors and Applications", *J. Phys. D.: Appl. Phys.*, V. 26, pp. 1149–1168 (1993).
J. I. Chyi, D. Biswas, S. V. Iyer, N. S. Kumar, H. Morkoc, R. Bean, K. Zanio, H. Y. Lee, H. Chen, *Appl. Phys. Letters*, 54, 1016 (1989) (pp. 1016–1018).
M. V. Rao, P. E. Thomson, R. Echard, S. Malpurri, A. K. Berry and H. B. Dietrich, *J. Appl. Phys.*, 69, 4228, (1991) (pp. 4228–4233).
N. F. Teede, "Single Crystal InSb Thin Films by Electron Beam Recrystallization", *Solid State Electronics*, V. 10, pp. 1069–1076, (1967) Pergamon Press, Great Britain.
D. L. Partin, L. Green and J. Heremans, "Growth of High Mobility InSb by Metalorganic Chemical Vapor Deposition", V. 23, N. 2, pp. 75–79, *Journal of Electronic Materials* (1994).

*Primary Examiner*—Marvin M. Lateef
*Attorney, Agent, or Firm*—George A. Grove

[57] ABSTRACT

A magnetic field sensor apparatus that comprises an active layer of indium antimonide or indium arsenide supported on an elemental semiconductor substrate. Magnetoresistor sensors of indium antimonide and indium arsenide active layers on silicon and germanium substrate wafers are described. Means are described for providing reduced electric fields and parasitic conduction in the elemental semiconductor substrate. The means includes unique device geometries and buffer layers between the active layers and the substrate wafers.

20 Claims, 7 Drawing Sheets

MAGNETIC FIELD SENSOR ON ELEMENTAL SEMICONDUCTOR SUBSTRATE WITH ELECTRIC FIELD REDUCTION MEANS

FIELD OF THE INVENTION

This invention relates to magnetic field sensors and, more particularly, to reduced-cost thin film high performance magnetoresistors.

BACKGROUND OF THE INVENTION

Indium antimonide (InSb) and indium arsenide (InAs) are widely recognized as being particularly useful as an active layer in magnetic field sensors such as magnetoresistors, Hall effect sensors (Hall sensors) and MAGFETS (magnetotransistors). Magnetic field sensors can be used in a variety of magnetic field sensing applications, including position and speed sensing, compass sensors, magnetic memory readout, and control of brushless motors.

Indium antimonide is particularly attractive for use as an active layer in magnetic field sensors, primarily because it has a high electron mobility. High electron mobility is important because it is primarily responsible for providing high magnetic sensitivity. On the other hand, indium antimonide has a low energy band gap, of about 0.18 eV at room temperature. This gives it an intrinsic carrier density that is large at room temperature. However, in addition, its intrinsic carrier density increases dramatically with increases in temperature. This tends to interfere with magnetic sensitivity.

Also, the conductivity increase with temperature is so significant that it is difficult to accommodate with the usual type of signal conditioning circuitry. Accordingly, it is typical to stabilize the carrier density in indium antimonide with respect to temperature variations by doping it n-type, typically within a factor of about 3 of $1\times10^{17}$ cm$^{-3}$. The n-type dopant is ordinarily tellurium, selenium, sulfur, silicon, tin or the like. This increases electron density to a higher level so that differences in intrinsic carrier density with temperature become insubstantial, or are more accommodateable with signal conditioning circuitry. On the other hand, the resulting higher conductivity material has relatively low electrical resistivity. This favors use of thin films of indium antimonide for magnetic field sensors.

For the case of indium arsenide, the temperature coefficient of resistance is lower than for indium antimonide because the energy gap is larger. An excess density of electrons, over the intrinsic density, can be obtained from a surface accumulation layer. Electrons in indium arsenide are known to accumulate near its surface where it contacts air. Alternatively, indium arsenide can also be doped n-type using silicon, germanium, tin, tellurium, selenium or sulfur. Whichever technique is used, it is preferable that the excess carrier density, when calculated on an areal basis, be on the order of 0.2 to $10\times10^{12}$ cm$^{-2}$.

In the past, thin slabs of indium antimonide were made by thinning down high quality bulk crystals. They were thinned down to slabs approximately 20 μm in thickness. Thinner slabs were desired for reducing series resistance of sensors made from such slabs. However, thinner slabs were difficult to produce by thinning bulk crystals. This led to the more recent practice of growing thin epitaxial films of indium antimonide on insulating gallium arsenide (GaAs) substrates. Such epitaxial films are typically grown to a thickness of approximately 1 to 3 μm, which increases sheet resistance (film resistivity divided by thickness) by an order of magnitude compared to thinned down bulk slabs.

It should be mentioned that a higher resistance device draws less current at a given voltage. It therefore dissipates less power for a given bulk voltage bias. Alternatively, it provides a larger output voltage for a given current bias. In any event, even films of only three micrometers in thickness still have too low a resistance for many applications.

In the case of magnetoresistors, a higher resistance is easily obtained by integrating many series connected rectangular magnetoresistor units into one sensor body. Typically, the rectangular magnetoresistor units are integrally formed in an elongated mesa or line of indium antimonide. In the mesa, they are integrally connected end to end, in series fashion. The mesa or line, i.e., the series connected magnetoresistor units, can be as long as needed to obtain the total resistance desired. The individual magnetoresistor rectangles are defined and connected in series by a plurality of spaced transverse "shorting bars". In such a construction, increased resistance in the resultant device is obtained by simply increasing the length of the indium antimonide mesa and the number of "shorting bars".

As indicated above, indium antimonide is of interest as a magnetic field sensor because it can be made with a high electron mobility. High electron mobility is obtained only if the indium antimonide is monocrystalline and indium antimonide crystal is of high quality. By that we mean that there are few crystal imperfections such as dislocations and the like.

High quality crystal structure in an epitaxial film is obtained if the substrate is a high quality crystal of the same type and approximate crystal size. In general, the better the match, the higher quality epitaxial layer can be grown. In addition, for highest magnetic sensitivity and lowest power consumption, the substrate should be electrically insulating. To satisfy these and still other requirements, prior magnetoresistor indium antimonide epitaxial fills have been typically grown on monocrystalline wafers of gallium arsenide (GaAs) or indium phosphide (InP). High quality epitaxial fills can be grown even though the gallium arsenide and indium phosphide lattice constants are smaller than that of indium antimonide. We know that others have studied films of indium antimonide grown on silicon. Silicon has an even smaller lattice constant than gallium arsenide or indium phosphide and has a significantly lower energy band gap. This might suggest inappropriateness for magnetic field sensors. However, the latter studies were for infrared sensing applications, where temperature is low and constant and where intrinsic substrate conduction at room temperature and high electron mobility is not of concern. Further, we are not aware that any practical infrared devices resulted from these studies.

As indicated above, magnetic field sensors should have a relatively stable and high electron mobility. Magnetic field sensors, particularly magnetoresistors, are subject to temperature cycling. Temperature cycling can be expected to degenerate a thin film in many properties, especially mobility. This is especially expected for temperature cycling of the extensive type experienced in automotive applications. Automotive sensor specifications, for example, require no significant change in sensor performance after extended temperature cycling from −40° C. to +200° C.

Magnetic field sensors have been made for such applications by growing indium antimonide fills on gallium arsenide or indium phosphide wafers. Substrate wafers of gallium arsenide or indium phosphide are attractive because of their relatively high energy band gap, which makes them insulating and of relatively high dielectric strength. On the other hand, gallium arsenide and indium phosphide wafers are quite costly, and availability is limited because of commercially limited applications.

We have surprisingly found that satisfactory magnetic field sensors can be made with indium antimonide films grown on wafers of elemental semiconductors such as silicon and germanium, especially silicon. We recognize that silicon has a greater lattice mismatch with indium antimonide than gallium arsenide or indium phosphide. We also recognize that silicon has a lower thermal coefficient of expansion than indium antimonide. We further recognize that silicon and germanium have a relatively low energy band gap. Nonetheless, durable films of indium antimonide have been made on silicon and germanium substrates that have relatively stable and high mobilities, even after automotive type thermal cycling.

Accordingly, despite factors leading one away from use of silicon and germanium as magnetoresistor substrates, we have found that they can be quite successfully used. Indium antimonide cannot only be grown on a silicon or germanium substrate but it can have fairly high mobility, even with the inherent lattice mismatch. The resultant mobility, though not the highest obtainable, is adequate for many magnetic field sensing applications contemplated in the automotive industry. On the other hand, to make a commercially successful magnetic field sensor, one must also overcome the basically objectionable higher conductivity and lower dielectric strength of the silicon or germanium substrate, as compared to gallium arsenide or indium phosphide.

We have found a variety of ways to overcome the fundamentally higher conductivity and lower dielectric strength of the silicon or germanium substrate. We provide many forms of electric field protection in the substrate. The electric field protection can be provided in a form that concurrently also reduces parasitic electrical conduction in the substrate, as will hereinafter be described in detail.

In addition, it should be mentioned that we have recognized that substrate wafers of silicon and germanium offer a significant cost advantage. Silicon and germanium wafers are less expensive and are available in larger sizes. The larger sizes provide a manufacturing cost advantage. In addition, silicon wafers are mechanically stronger than the gallium arsenide or indium phosphide wafers. This is attractive for commercial production operations, which increases yields of satisfactory wafers. Also, the stronger material permits use of thinner wafers, which is beneficial from a magnetic circuit point of view. In other words, thinner substrates can allow thinner "air gaps", or regions of the magnetic circuit in which the magnetic permeability is near unity.

OBJECT AND SUMMARY OF THE INVENTION

It is, therefore, an object of this invention to provide a magnetic field sensor of an indium antimonide film or indium arsenide film supported on an elemental semiconductor substrate. Another object is to provide such a sensor that also has means for reducing electric fields and/or parasitic currents in the substrate.

Still another object of the invention is to provide a magnetic field sensor having an indium antimonide or indium arsenide active film supported on a gallium arsenide or indium phosphide thin film that is, in turn, supported on an elemental semiconductor substrate.

A further object of the invention is to provide a magnetic field sensor having an indium antimonide active film directly on a silicon substrate, with the indium antimonide and/or the substrate configured to minimize electric fields imposed in the silicon substrate by voltages applied to contacts to the indium antimonide film.

As indicated, this invention involves a magnetic field sensor having an indium antimonide or indium arsenide epitaxial film supported on a monocrystalline elemental semiconductor substrate. The indium antimonide or indium arsenide film is either directly on the elemental semiconductor or on an intermediate film that has a higher resistivity than that of silicon. Electric fields in the elemental semiconductor substrate are maintained below breakdown voltage. Parasitic electrical conduction through the substrate is also preferably reduced. The voltage and parasitic conduction control are achieved by one or more of the following: geometry of the active layer mesa; geometry of the substrate adjacent the active layer mesa; a higher resistivity film between the active layer mesa and the substrate; and special control of voltage applied to the active layer with respect to fields applied to the substrate.

A thin film of a related compound semiconductor, such as gallium arsenide or indium phosphide, on silicon can be used as an intermediate layer between indium antimonide or indium arsenide layer and the silicon substrate. It not only has a higher energy band gap than silicon but also has a lattice constant between that of silicon and indium antimonide or indium arsenide. This should result in a higher electron mobility in the indium antimonide or indium arsenide, and a higher attendant magnetic sensitivity.

Other objects, features and advantages of this invention will become more apparent from the following description of the preferred embodiments thereof and from the drawings.

DETAILED DESCRIPTION

As mentioned above, indium antimonide or indium arsenide magnetic field sensor films are generally grown on gallium arsenide or indium phosphide substrate wafers. Such substrate materials have a relatively high energy band gap. Also, they are close enough in lattice constant that deposit thicknesses of indium antimonide (the active layer) greater than about 0.5 µm are of good quality. The quality of the film generally improves with increasing thickness. For simplicity, this detailed description will mostly describe indium antimonide as the active layer. However, it is to be understood that the active layer could alternatively be indium arsenide.

We recognize that there is a significant lattice mismatch between indium antimonide or indium arsenide and elemental semiconductors, especially silicon. We also recognize that elemental semiconductor materials such as silicon and germanium have a relatively low energy band gap and have a large difference in thermal expansion coefficient compared to indium antimonide. This suggests that such materials would be unsuitable as magnetic field sensor substrate materials. Nonetheless, we have found that high electron mobility indium antimonide films can be formed on such materials and that the high mobility is relatively stable under extensive thermal cycling. For example, it can be made to withstand hundreds of cycles between −40° C. and 200° C., making such a product of interest for automotive applications especially. This disclosure not only reveals the foregoing but teaches how to make satisfactory magnetic field sensors from such materials, even though the substrate exhibits undesirably high conductivity and low dielectric strength.

Accordingly, the broadest aspect of this invention involves the recognition that an intrinsic elemental semiconductor such as silicon or germanium can be used as a low cost substrate for satisfactory magnetic field sensors. However, to be satisfactory, especially as magnetoresistors for automotive applications, the more specific principles of this invention should be employed.

The more specific principles of this invention primarily involve maintaining electric fields in the elemental semiconductor substrate below breakdown voltage of the substrate material. In addition, highest magnetic sensitivity is obtained by increasing electrical resistance in the parallel parasitic path through the substrate. This can be done with unique active layer and/or substrate geometries, and/or by the inclusion of a higher resistivity layer between the active layer and the substrate. This not only reduces electric fields in the elemental substrate, which permits use of higher resistances and attendant voltages in the active layer, but also reduces a parasitic conductance in the substrate (which reduces magnetic sensitivity).

Figure 13:
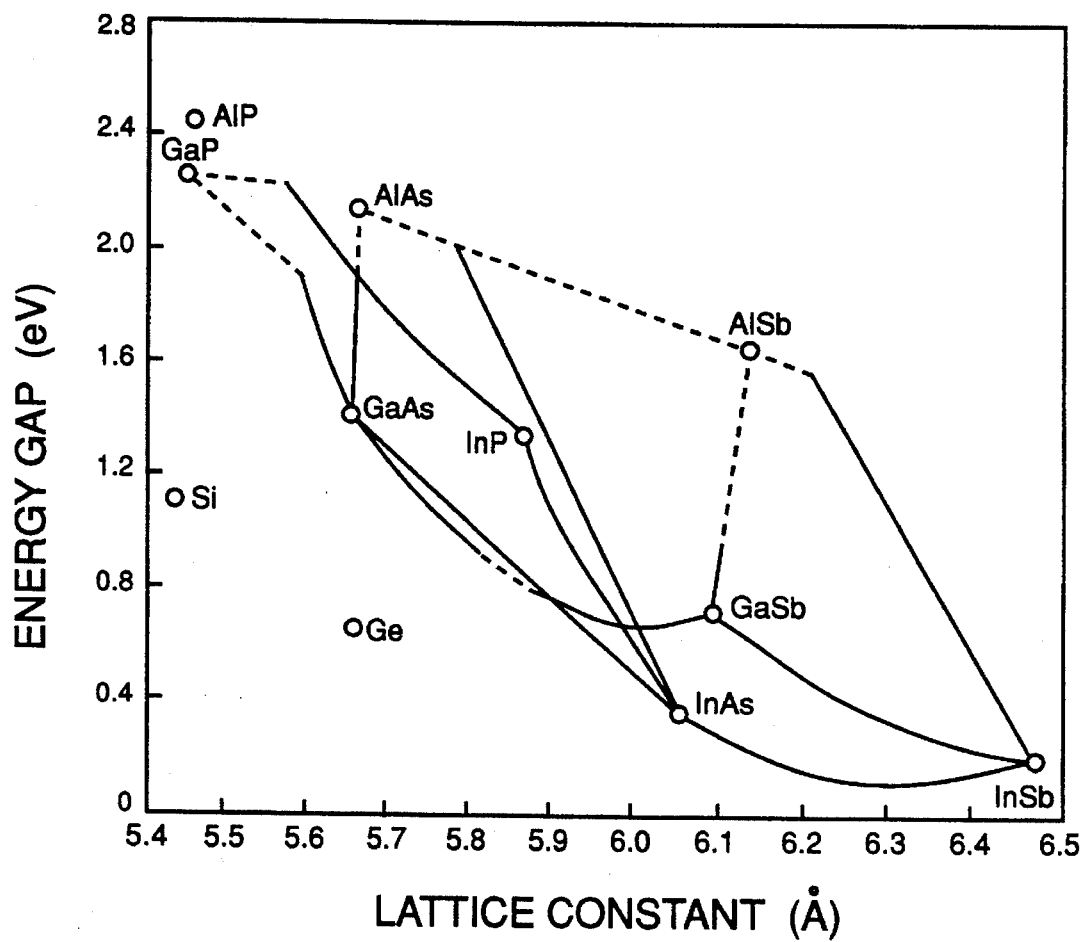
FIG. 13 shows a diagram in which lattice constant of various compositions is plotted against energy band gap.

Still further, if the intermediate layer is of a monocrystal having a lattice constant intermediate that of an indium antimonide active layer and the elemental semiconductor, the active layer tends to be of higher quality than if grown directly on the elemental semiconductor and of attendant higher electron mobility. Higher electron mobility, as mentioned, leads to higher magnetic sensitivities. Indium antimonide has a significantly larger lattice constant than indium arsenide, as can be seen in FIG. 13. As a result, the benefits in improved electron mobility from using the intermediate layer may not be as dramatic for indium arsenide active layers as they are for indium antimonide active layers.

Figure 1:
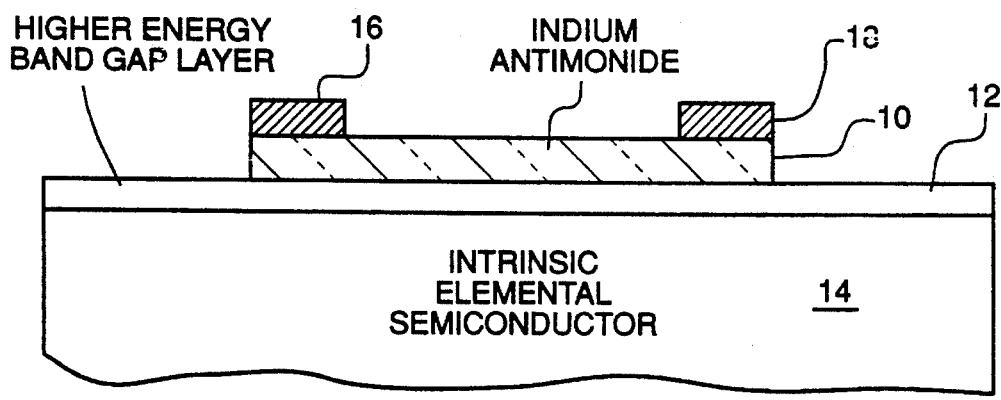
FIG. 1 shows a diagrammatic cross-sectional view of a magnetoresistor unit made in accordance with the invention.

Reference is now made to FIG. 1 which shows a single magnetoresistor unit that comprises a rectangular epitaxial indium antimonide mesa layer 10 that is disposed on a higher energy band gap epitaxial compound semiconductor layer 12, as for example gallium arsenide. Layer 12 should have an energy band gap higher than that of silicon and preferably be a monocrystalline III–V compound semiconductor material having a lattice constant between that of silicon and indium antimonide. Gallium arsenide is such a compound semiconductor. The gallium arsenide epitaxial layer 12 is, in turn, disposed on an intrinsic elemental semiconductor crystal body such as a monocrystalline wafer of silicon or germanium. By "epitaxial", we mean that the layer is monocrystalline as deposited on the surface it contacts. By "intrinsic", we mean that the semiconductor material is undoped. This means that the material is not intentionally doped. However, since no semiconductor can be made perfectly pure, some residual impurities are always present, although for silicon the concentration of electrically active impurities may be reduced, for example, to well below $10^{13}$ cm$^{-3}$. However, there is a tradeoff, since the cost of the silicon is greater as its purity is made greater.

The right and left opposite edges of the rectangular indium antimonide mesa shown in FIG. 1 are the long edges of the mesa rectangle. These edges respectively have metal electrodes 16 and 18 formed thereon. The dimensions of the mesa rectangle ordinarily are a matter of design choice. However, generally speaking, the length of the rectangular sides under gold electrodes 16 and 18 are generally longer than the other two sides. Some of the principles involving dimensions of such rectangular areas and for methods of forming a plurality of serially connected but integrated areas of this type are described in U.S. Pat. No. 4,926,154, issued May 15, 1990, to some of the inventors named in this patent application. That disclosure is incorporated herein by reference.

The gallium arsenide layer 12 can be of any thickness up to about two microns. If the gallium arsenide layer 12 is used, we generally would like it to be of a thickness of approximately 0.01 to 2.0 µm.

The indium antimonide layer would nominally be about two microns thick. However, it is preferred that it be as thin as is practical. Because of lattice mismatch, indium antimonide layer 10 needs to be at least about 0.5 µm thick if grown directly on silicon or even if grown on a gallium arsenide layer. Use of the intermediate layer 12 is particularly important when germanium substrates are used because of germanium's especially low energy band gap and consequent high conductivity. Otherwise, only very thick layers 10 of indium antimonide will have to be used. This is objectionable.

On the other hand, in order to maintain preferred magnetoresistor resistances and to keep manufacturing costs down, thickness of the indium antimonide is generally not allowed to exceed about 5 µm. We generally prefer to use indium antimonide thicknesses of less than 3 µm, and most preferably do not allow them to exceed about 2 µm. It is understood that there could possibly be some applications where someone might want to use thicker indium antimonide. However, in most commercial applications, we expect that one would want to use as low a thickness of indium antimonide as is practical, while still obtaining reasonable average electron mobility. By "average" electron mobility, we mean the average electron mobility through the entirety of the thickness and area of a given film, as for example the entire area and thickness of mesa layer 10.

In FIG. 1, a voltage difference is applied to electrodes 16 and 18 from a source (not shown) which is effective to provide an electron flow between electrodes 16 and 18 through indium antimonide layer 10. As indicated above, the voltage difference between electrodes 16 and 18 concurrently subjects the intrinsic elemental semiconductor crystal 14 to electric fields. These electric fields can be quite strong, especially if transient voltages can occur. It is conceivable that a constant current voltage source could apply quite high voltages, for example if it was turned on before its terminals are connected to electrodes 16 and 18, or if an open circuit momentarily occurs with the electrodes. In any event, if layer 12 is of a higher energy band gap material than silicon, as for example gallium arsenide or indium phosphide, layer 12 becomes substantially higher in resistivity than substrate 14. Consequently, a corresponding proportion of an electric field resulting from voltage applied to electrodes 16 and 18 will be dropped through the higher resistance layer 12. Hence, the elemental semiconductor crystal 14 will see a significantly lesser electric field. In such instance, the higher energy band gap layer 12 provides a significant electric field protection, or electric field reduction, for the substrate material 14. Concurrently, parasitic current flow through substrate 14 is reduced.

We prefer gallium arsenide or indium phosphide as the intermediate layer 12 because the techniques for depositing high quality indium antimonide on them are well known. This leads to higher yields and, of course, lower cost. On the other hand, we recognize that a wide variety of other compound semiconductors could be used for layer 12 as, for example, aluminum arsenide, aluminum gallium arsenide, aluminum indium antimonide, aluminum gallium antimonide and aluminum gallium arsenide antimonide. All of these materials not only have energy band gaps higher than that of silicon and germanium but also have a lattice constant between indium antimonide and the elemental semiconductors germanium and silicon. A graph showing energy band gap and lattice constant for such compound semiconductors is shown in FIG. 13. If indium antimonide is grown on such compound semiconductor layers, the resultant indium antimonide should have a higher electron mobility and therefore a higher magnetic sensitivity than if it were grown directly on silicon. If the energy band gap is higher, parasitic losses should be lower and electric fields in the substrate reduced. In the case of an indium arsenide active layer, an aluminum gallium antimonide buffer layer 12 is especially useful since it nearly lattice matches to indium arsenide. Pure GaSb is undesirable since it forms a Type II heterojunction with indium arsenide with many low mobility holes. Pure AlSb is undesirable since it is very chemically reactive with air. Hence, we prefer $Al_x Ga_{1-x}Sb$ with $0.3 \leq x \leq 0.5$. Furthermore, the quaternary $Al_xGa_{1-x}As_ySb_{1-y}$ can be exactly lattice matched to indium arsenide, with $0.3 \leq x \leq 0.5$ and $0.05 \leq y \leq 0.15$.

One might expect that layer 12 should be of considerable thickness, to minimize substrate interaction with the active layer. This is not true for gallium arsenide and indium phosphide. We have found that thicker intermediate layers are objectionable. This may be due to differences in physical properties with the substrate and/or the active layer. We generally want layer 12 to be less than about two microns thick. This provides adequate field reduction but does not introduce damaging side effects that would offset the benefit this layer provides in field reduction, parasitic current reduction and lattice matching. If the gallium arsenide is in excess of about b 2μm, one side effect is that catastrophic effects occur, such as cracking, flaking and the like, to the gallium arsenide layer.

Figure 2:
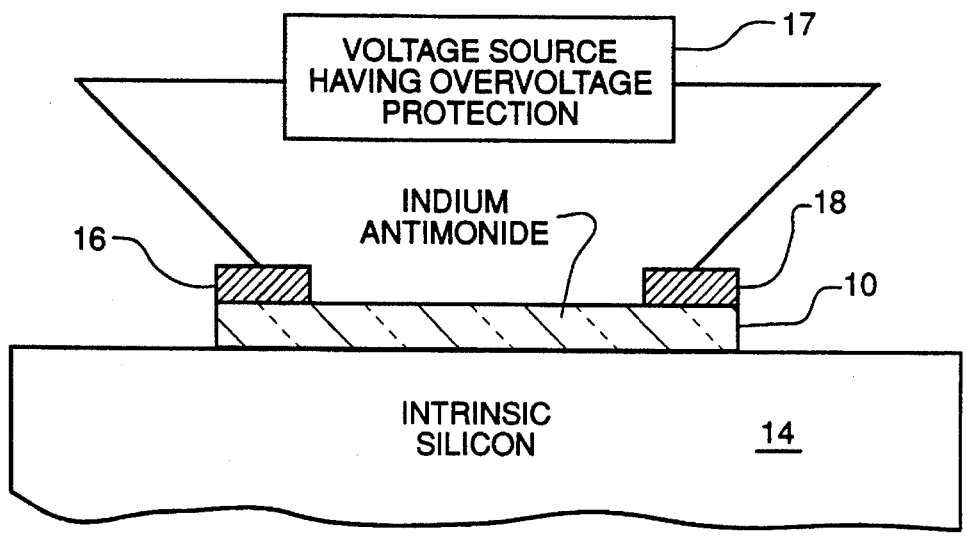
FIG. 2 shows a diagrammatic cross-sectional view of an alternative embodiment of a magnetoresistor unit made in accordance with this invention.

Reference is now to made to FIG. 2 which shows an indium antimonide rectangular layer 10 directly on a silicon substrate 14. The rectangular layer is the same as described in FIG. 1. For that reason, the same reference numeral is used. Analogously, silicon substrate is similar to the substrate 14 in FIG. 1, hence a similar reference numeral is used. This same pattern of repeating reference numerals is used in the following drawings as well, to connote that the referenced parts are similar to what has already been described.

The embodiment shown in FIG. 2 does not include the intermediate layer 12 shown in FIG. 1. Indium antimonide layer 10 is thus a rectangular epitaxial mesa that is grown directly on silicon substrate 14. It has metal electrodes 16 and 18 on its opposed long sides, similar to FIG. 1. Metal contacts are preferably gold-germanium or gold-tin electrodes but can be of any other metal known and acceptable as a contact metal to indium antimonide. Electrodes 16 and 18 are connected to a voltage source having overvoltage protection in its circuitry. The voltage source 17 has means to limit ordinarily applied voltages to a safe value with respect to electric fields generated in the silicon substrate. It also has means to prevent transient voltages from exceeding that value. FIG. 2 therefore illustrates a technique by which an indium antimonide active layer 10 can be disposed directly on an intrinsic silicon substrate 14.

Figure 3:
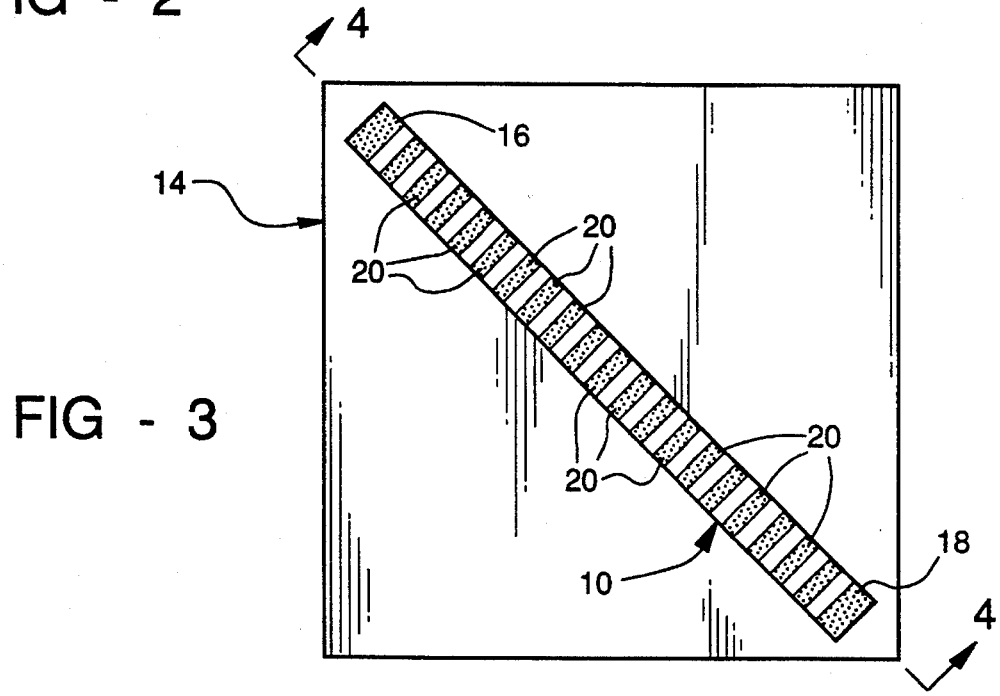
FIG. 3 shows a plan view of an integrated plurality of magnetoresistor units forming a sensor made in accordance with this invention.
Figure 4:
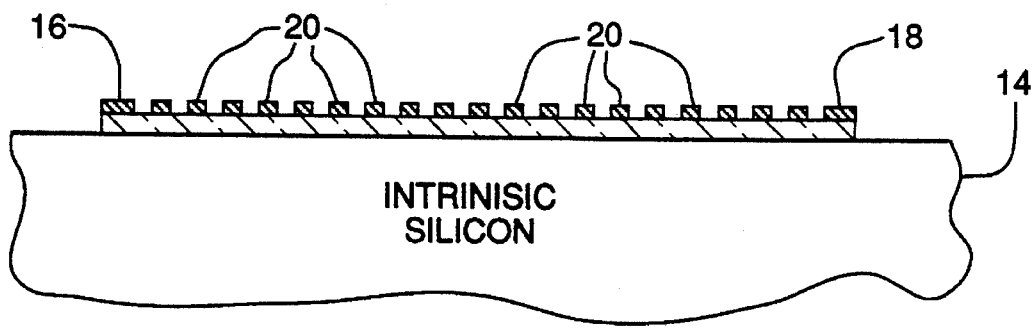
FIG. 4 is a sectional view along the line 4—4 of FIG. 3.

Preselected voltages can be applied between electrodes 16 and 18 without detrimentally affecting the underlying silicon substrate. As previously indicated, we have unexpectedly found that an indium antimonide layer of moderately high electron mobility can be formed on silicon. In addition, we found that even under extensive thermal cycling, the electron mobility remains high even though there is a vast difference in thermal expansion coefficient between the active layer and the substrate. Such a device can be formed if the indium antimonide layer is maintained at a thickness of about 3 μm or less. On the other hand, because of the lattice mismatch between silicon and indium antimonide, it is likely that the indium antimonide layer will have to be at least about 0.5 μm thick before indium antimonide of high mobility can be deposited. Accordingly, we prefer that the indium antimonide layer 10 be about 0.5 to 3.0 μm thick. The maximum voltage to which electrodes 16 and 18 can be subjected depends upon factors such as how far apart the electrodes are on the silicon substrate and on what the temperature is at the time the voltage is applied. By way of example, for a voltage of about 12 volts at a temperature of about 300K, we would want a minimum spacing between electrodes 16 and 18 of about 0.1 mm or more, especially if electrodes 16 and 18 overlap the ends of layer 10 onto the silicon substrate 14 as shown in FIGS. 3 and 4. This not only avoids dielectric breakdown through the substrate 14 if voltage transients much larger than 12 volts occur, but also keeps the electric fields due to the 12 volt bias small enough to minimize leakage currents through the substrate 14.

FIG. 2 illustrates that one can limit voltage applied to a single magnetoresistor cell to prevent shorting through substrate 14. On the other hand, as shown in FIGS. 3 and 4, and also as shown in the aforementioned U.S. Pat. No. 4,926, 154, Heremans et al, an integrated magnetoresistor sensor is normally made of a plurality of series connected magnetoresistor units or cells. The series connected units are integrated by simply forming an elongated mesa of indium antimonide and forming a plurality of transverse "shorting bars" 20 at spaced locations along the length of mesa. Metal terminals 16 and 18 of the respective ends of the indium antimonide mesa would be formed at the opposite ends of the elongated indium antimonide mesa at the same time the "shorting bars" 20 would be formed. They can be formed by photolithography of a blanket metal deposition.

As shown in FIG. 3, when the indium antimonide is disposed directly on top of silicon, some form of electric field protection has to be provided. It is provided very simplistically in this embodiment of the invention by making the indium antimonide layer straight and disposing the terminals 16 and 18 at opposite corners of the silicon substrate 14. This is a very simplistic form of integrated magnetoresistor sensor structure in accordance with this invention. It will necessarily have a relatively short length and low series resistance in any chip of reasonably small size. The indium antimonide is placed diagonally rather than parallel to the edges of the silicon chip to maximize its length and, hence, its resistance. This also minimizes the electric field in the silicon substrate for a given bias voltage.

In practice, one normally would make a U-shaped or sinuous type of indium antimonide mesa conformation to obtain the longest length of mesa that can be formed in a given unit area of substrate. However, in many instances with such a construction, the end terminals 16 and 18 end up being disposed side by side on the silicon substrate. In such a construction, one might ordinarily dispose terminals 16 and 18 close to one another. This would subject the silicon substrate portions therebetween to an objectionable voltage difference.

Figure 5:
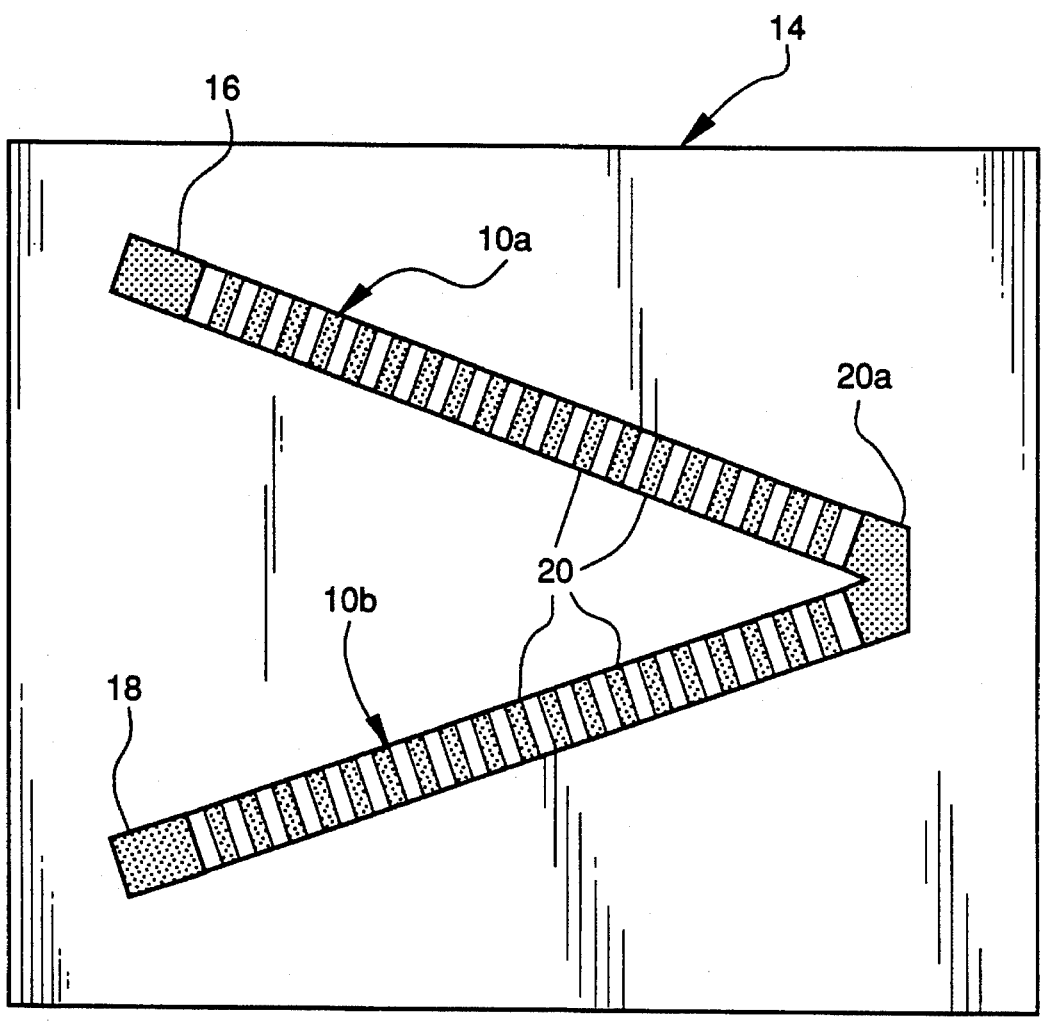
FIG. 5 shows an elongated embodiment of the integrated magnetoresistor sensor shown in FIG. 3, which embodiment has a geometry according to principles of this invention.

In this invention, sinuous mesas can be formed but have to be formed with discretion consistent with the principles described herein. For example, FIG. 5 shows how one can almost double the length of the indium antimonide mesa 10 on the substrate 14 without placing either of the terminals 16 or 18 close together. In this instance, one-half of the length of the mesa 10 in FIG. 5 is referred to by reference numeral 10a. The other half is referred to by reference numeral 10b. It can be seen that the right-hand ends of the indium antimonide mesas 10a and 10b are covered by an enlarged single "shorting bar" 20a. Incidentally, "shorting bars" 20 are shown coextensive with the mesas. In practice, they could extend off the side edges of the mesa onto adjacent silicon, if the silicon were covered with a dielectric, or other very high electrical resistance layer, as for example silicon oxide. With the V-shaped geometry of the active layer in FIG. 5, only the "shorting bars" 20 of low voltage difference are disposed close to one another. In other words, as the voltage difference between "shorting bars" increases, so does their spacing. It is recognized that for convenience we choose to show a simple V for this geometry. On the other hand, it is recognized that one might choose to use other rectilinear shapes, curvilinear shapes and other angles of divergence. For example, one could use short undulated mesa sections along a narrow elongated supportive substrate. Such a structure would be analogous to the mesa sections 10a, 10b and 10c in FIG. 7 but with sections 10a, 10b, and 10c shorter in length and no trenches 30a and 30b present.

Figure 6A:
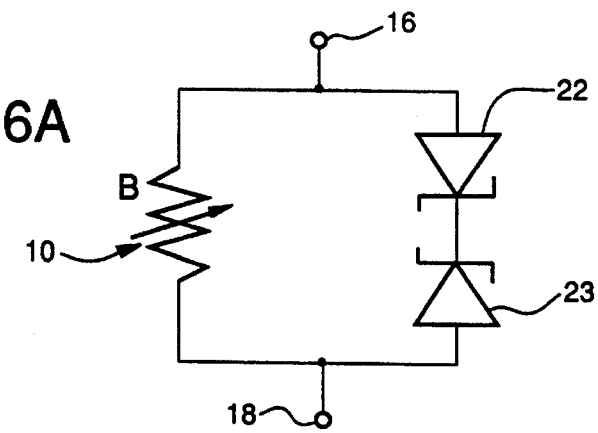
FIG. 6A depicts the schematic equivalent electrical circuit of the sensor shown in FIG. 6B.
Figure 6B:
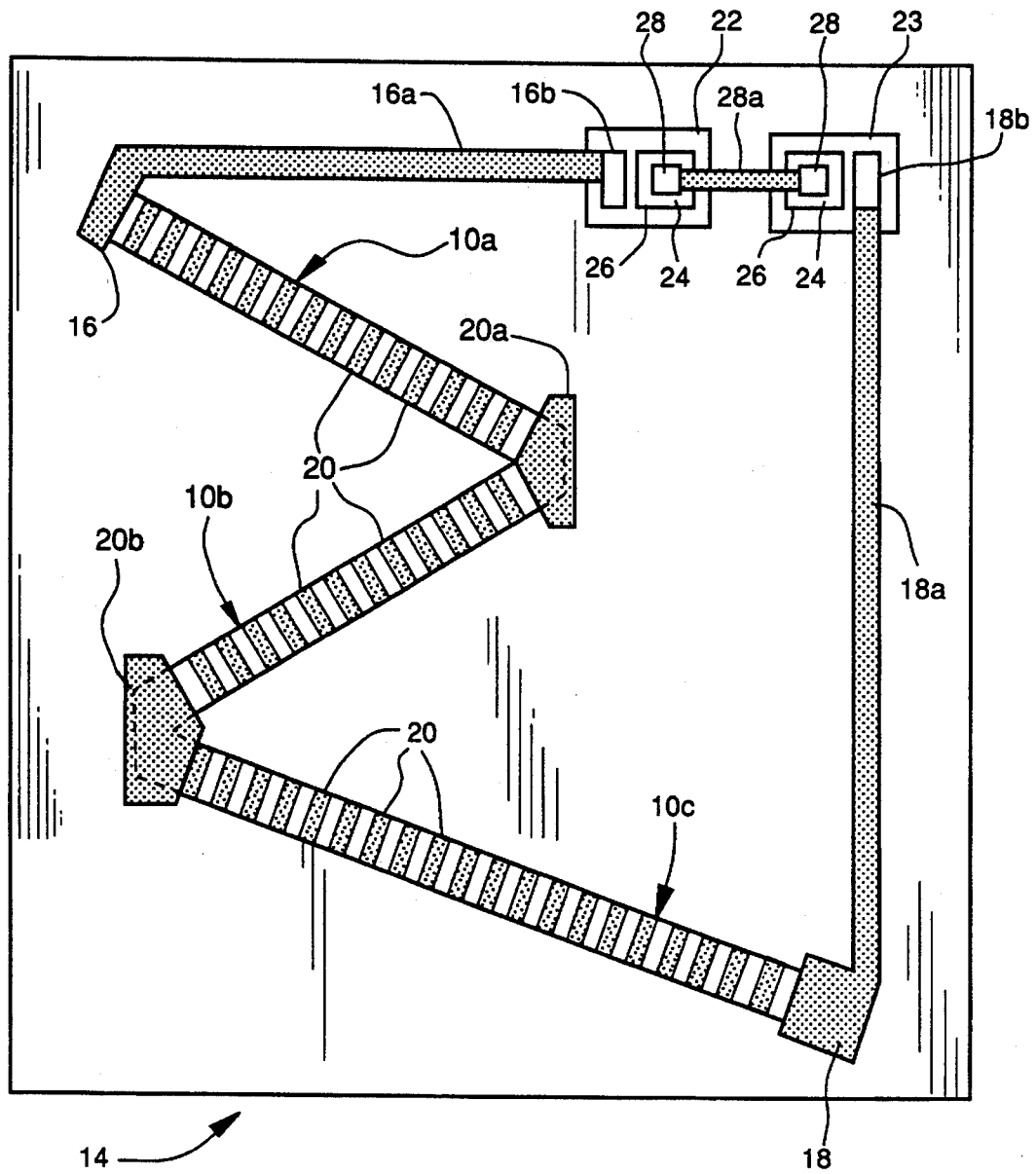
FIG. 6B shows a still further elongated geometry of the integrated magnetoresistor sensor shown in FIG. 5.

Reference is now made to FIG. 6B which shows an integrated magnetoresistor sensor of an undulating pattern that is made in accordance with this invention. In this particular form of undulating pattern, one can consider it to be two interconnected "V" shapes such as shown in FIG. 5. One could also view this configuration as one in which merely another elongated mesa 10c has been added to the FIG. 5 structure and connected to it by an additional enlarged "shorting bar" 20b. In any event, an arbitrary number of additional elongated mesas can be used to obtain any overall length of mesa and attendant resistance in the integrated magnetoresistor sensor. The particular length desired and the particular thickness and width of any mesa leg is a matter of design choice. However, as indicated in connection with FIG. 5, it can be seen that the FIG. 6B construction increases the spacing between "shorting bars" as the voltage between them increases. Thus, a measure of field reduction in the silicon substrate is produced.

As shown in FIG. 2, it is desired to give the silicon substrate some measure of over voltage protection. More specifically, we desire to prevent the silicon substrate from being exposed to voltages in excess of the breakdown voltage of the silicon substrate. One can limit the voltages that will be applied to the magnetoresistor by means of a sophisticated voltage supply source that screens out all overvoltages from transients and the like. However, it might even be simpler to include means directly on the silicon substrate to dissipate the energy of a transient. Also, one might want redundant overvoltage protection on the chip as well. In such instance, one might want to incorporate two zener diodes, on the silicon substrate, such as shown in FIGS. 6A and 6B. It is also possible to dissipate such energy by means of other components as, for example, a capacitor. These additional components may be monolithically included as shown or affixed to the silicon surface in a hybrid integration form. In any event, we want to recognize that one can couple the concept of geometry control along with the use of additional components to protect the underlying silicon substrate from undesirable field effects.

More specifically, FIG. 6B shows two P-type regions 22 and 23 disposed in the upper right-hand corner of substrate 14. P-type regions 22 and 23 are each an island-like region that has an N-type island-like region 24 wholly disposed within it and establishing PN junction 26 therebetween. A blanket silicon oxide layer covers the upper surface of substrate 14. However, it is not shown to avoid overcomplication. A separate island-like metal electrode 28 on the silicon oxide blanket layer makes contact with each N-type island 24 through a window in the silicon oxide layer. Metal portion 28a interconnects the two electrodes 28. Metal electrode 16, having parts 16a and 16b, is also disposed on the blanket silicon oxide layer. Electrode part 16b makes contact with the P-type island through a window in the silicon oxide layer. Electrode part 16b communicates with magnetoresistor terminal 16 by means of integral electrode part 16a. Metal electrode 18 has parts 18a and 18b, all of which are disposed on the silicon oxide layer. Electrode part 18b is in low electrical resistance contact with P-type island 23 through a window in the silicon oxide blanket layer. Electrode part 18b communicates with magnetoresistor terminal 18 by means of integral electrode part 18a.

Spikes in voltage occurring at terminal 16 would be readily discharged through the zener diode PN junctions 26. In this manner, voltage spikes are dissipated before they can subject silicon substrate 14 to any electric fields exceeding its dielectric strength. Thus, voltage protection is integral.

Figure 7:
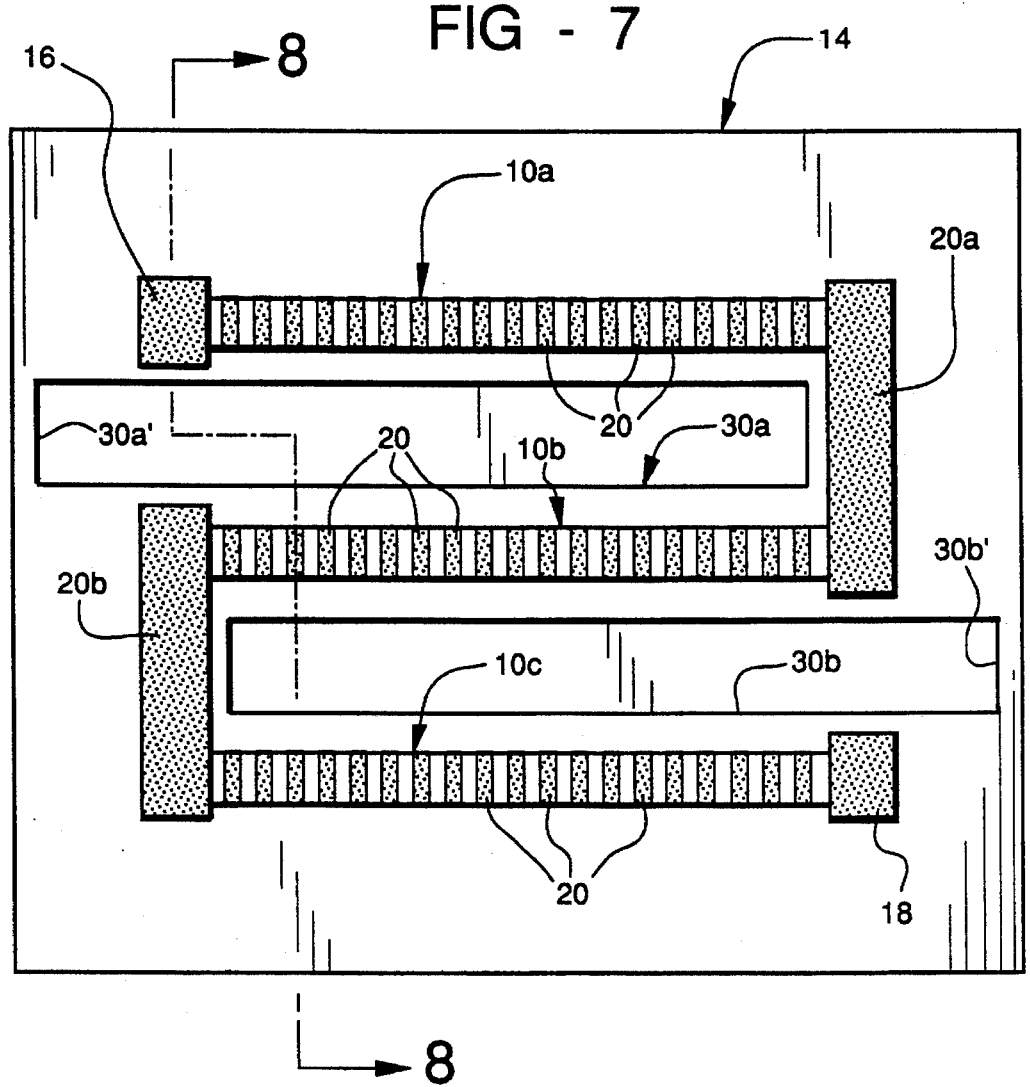
FIG. 7 shows a plan view of a conventional integrated magnetoresistor sensor geometry to which trenches have been added in the substrate for field relief.
Figure 8:
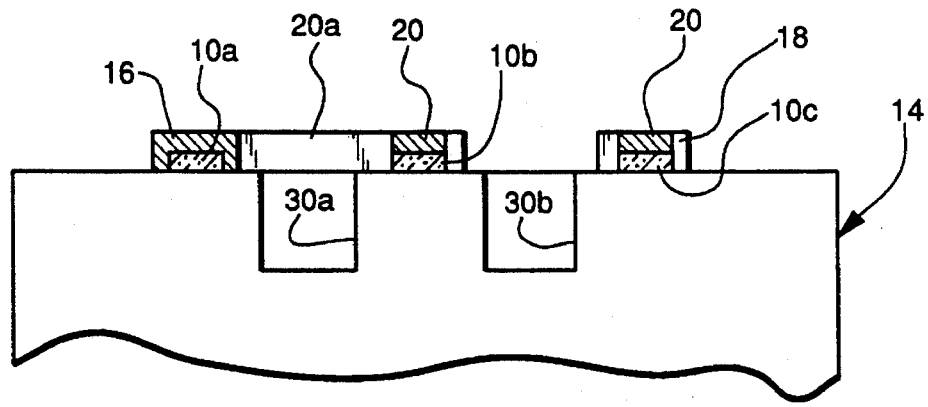
FIG. 8 shows a sectional view along the line 8—8 of FIG. 7.

Reference is now made to FIGS. 7 and 8, which show still another embodiment of this invention. The embodiment of FIGS. 7 and 8 show a silicon substrate 14 having three parallel indium antimonide mesas 10a, 10b and 10c. Each of mesas 10*a*, 10*b* and 10*c* have a plurality of transverse "shorting bars" 20 of gold or the like. Mesas 10*a* and 10*b* are interconnected at their right end by enlarged "shorting bar" 20*a*. Analogously, mesas 10*b* and 10*c* are interconnected at their left ends by enlarged "shorting bar" 20*b*. The left end of mesa 10*a* has terminal contact 16. The right end of mesa 10*c* has terminal contact 18. The "shorting bars" form a plurality of rectangular magnetoresistor areas or units that are integrally connected in series.

Silicon substrate 14 has a deep elongated trench 30*a* between and parallel to indium antimonide mesas 10*a* and 10*b*. It can be seen that the trench 30*a* starts from a location to the left of terminal 16 and enlarged "shorting bar" 20*b* and extends almost to enlarged "shorting bar" 20*a*. If there is a significant voltage difference between terminal 16 and "shorting bar" 20*d*, it is important that trench 30*a* have some extension 30*a*' to the left of them. This increases the resistance between them and the electrical fields in the silicon substrate portions between them. Analogously, it can be seen that there is a trench 30*b* in silicon substrate 14 between indium antimonide mesas 10*b* and 10*c*. Trench 30*b* has an extension 30*b*' out beyond the area between "shorting bar" 20*a* and terminal 18. Extension 30*b*' is important if a high voltage difference is experienced between enlarged "shorting bar" 20*a* and terminal 18. Accordingly, the purpose of the trench extension 30*b*' is analogous to the trench extension 30*a*'. It can be seen that the other end of the trench 30*b* extends almost to "shorting bar" 20*b*. It is not particularly critical that the sides of trenches 30*a* and 30*b* be perfectly parallel mesas 10*a*, 10*b* and 10*c*. Further, it is not particularly critical that the trench 30*a* extend extremely close to enlarged "shorting bar" 20*a* or that trench 30*b* extend quite close to enlarged "shorting bar" 20*b*. The reason for this is that the voltage difference between "shorting bars" on opposite sides of these trenches at this point is relatively small. The same is true with respect to "shorting bars" adjacent to enlarged "shorting bar" 20*b*.

In further analogy and example, while we show trenches 30*a* and 30*b* as having parallel sides, one might choose to make the trench 30*a* widest at the end 30*a*' and narrower adjacent enlarged "shorting bar" 20*a*. Analogously, one might choose to make trench 30*b* widest at its end 30*b*' and narrower adjacent enlarged "shorting bar" 20*b*. This would reduce the field the most where the voltage difference is the highest. Still further, from a manufacturing convenience standpoint, trenches 30*a* and 30*b* are of the same depth. Like the width of trenches 30*a* and 30*b*, their depth is a matter of design choice, depending on the voltages that are applied to terminal 16 and 18, and more particularly the voltage difference between terminal 16 and enlarged "shorting bar" 20*b* and the voltage between terminal 18 and enlarged "shorting bar" 20*a*, as those voltages are applied during use of the magnetoresistor sensor comprised of the individual magnetoresistor units formed in each of mesas 10*a*, 10*b* and 10*c*.

It should be recognized that trenches 30*a* and 30*b* also increase electrical resistance in substrate 14 between portions of substrate 14 that are respectively under terminals 16 and 18. This increase in electrical resistance can reduce parasitic electrical conduction through silicon substrate 14 between terminals 16 and 18. A reduction in this parasitic current effectively increases sensitivity of the resultant composite magnetoresistor. In this connection, one may choose to make trenches 30*a* and 30*b* deeper than what might be required from an electrical field standpoint. Trench 30*a*, for example, might extend closer to the enlarged "shorting bar" 20*a*, and even have an extension (not shown) on the opposite side of enlarged "shorting bar" 20*a* to help pinch current flow. Moreover, for similar reasons, this latter (unshown) extension might extend right out to the edge of substrate 14, as might the opposite end 30*a*' of trench 30*a*. In such instance, current could only flow from the silicon portion under terminal 16 into the silicon under mesa 10*b* by means of a thin silicon web at the bottom of trench 30*a* or by means of the silicon bridge under enlarged "shorting bar" 20*a*. Analogously, from the silicon portion under mesa 10*b*, if mesa 30*b* is similarly constructed, current could only flow from the silicon under mesa 10*b* through a thin web under the bottom of trench 30*b* or the silicon bridge under an enlarged "shorting bar" 20*b*. All in all, this increases electrical resistance in the silicon between terminals 16 and 18. It should also be mentioned that trenches 30*a* and 30*b* could extend through the entire thickness of substrate 14 and become slots. However, this would obviously reduce the structural integrity of substrate 14. Accordingly, in some instances we would probably not want to have trenches 30*a* and 30*b* extend completely through substrate 14 and become slots, especially if trenches 30*a* and 30*b* are extended at their ends 30*a*' and 30*b*' to the edges of the substrate 14, as discussed above. Also, the number of indium antimonide mesa legs 10*a*, 10*b*, etc., and attendant trenches 30*a*, 30*b*, etc., is arbitrary, as discussed in connection with FIG. 6. Two or more indium antimonide mesas of significant length may be used in this design.

Figure 9:
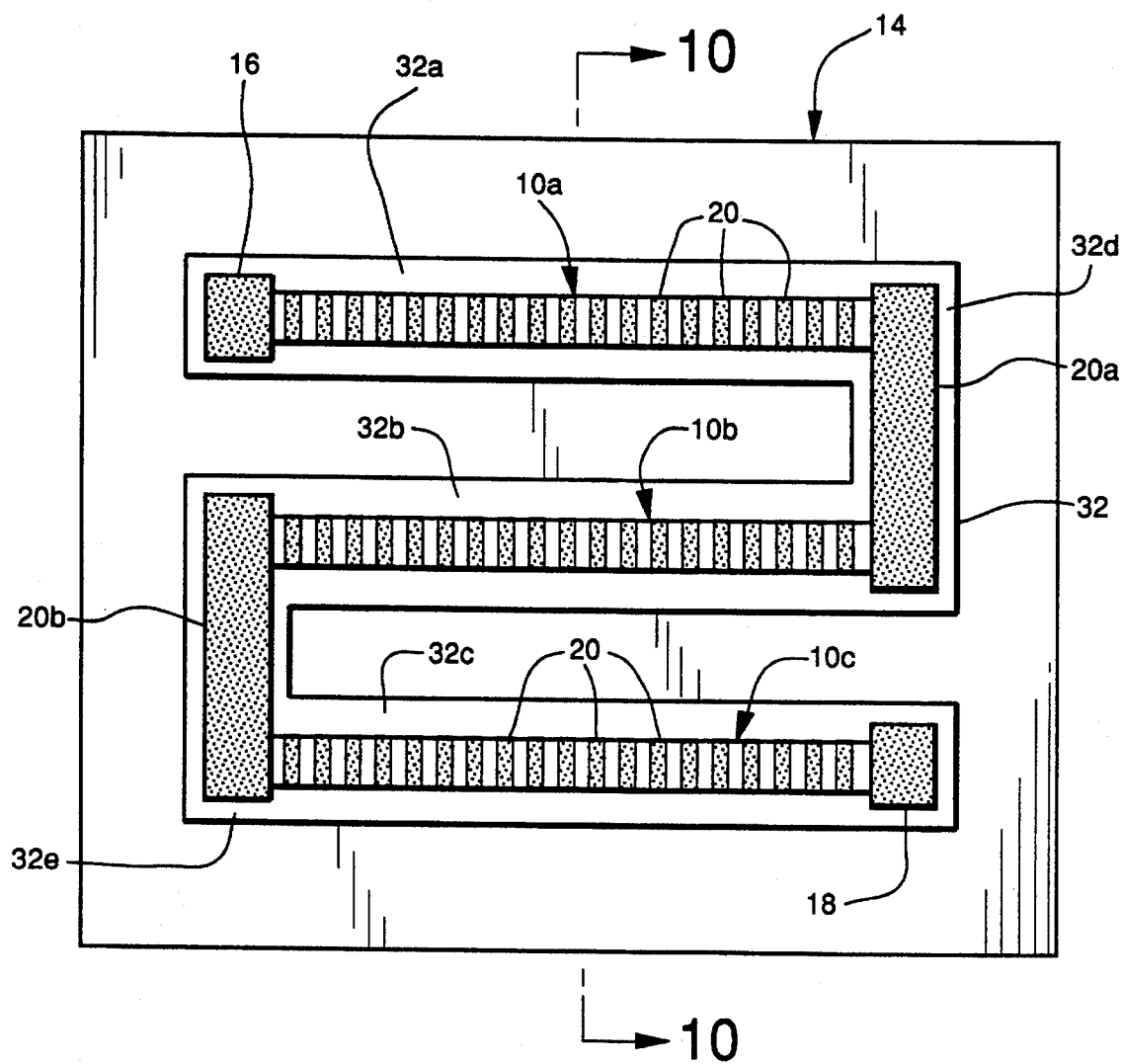
FIG. 9 shows a plan view of a conventional magnetoresistor geometry but with an intermediate layer in the form of a mesa between the active layer and the substrate.
Figure 10:
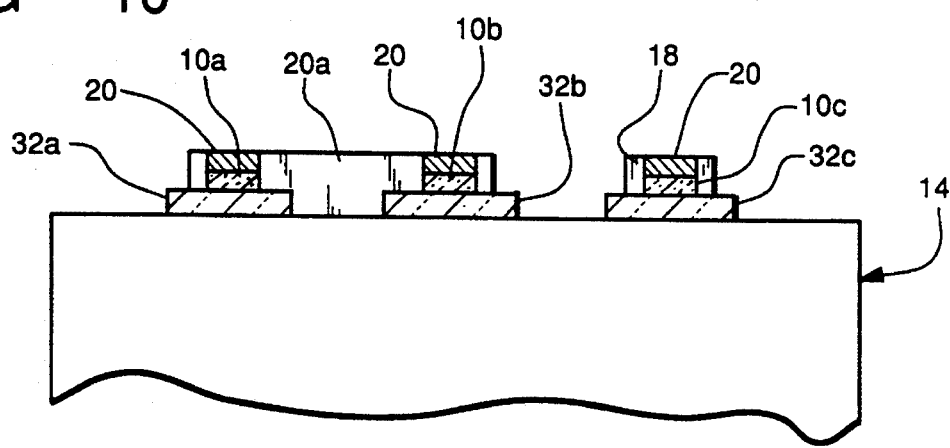
FIG. 10 shows a sectional view along the line 10—10 of FIG. 9.

Reference is now made to FIGS. 9 and 10 which show still another way to reduce electrical fields in the silicon substrate 14. In addition, this particular embodiment of the invention also substantially eliminates parasitic conduction through the silicon. As previously indicated, a reduction in the parasitic electrical conduction through substrate 14 increases the proportion of current flowing between terminals 16 and 18 that is effected by magnetic field. This effectively increases magnetic sensitivity of the resultant composite magnetoresistor.

In FIGS. 9 and 10, indium antimonide mesa portions 10*a*, 10*b* and 10*c* are closely spaced and parallel on monocrystalline silicon substrate 14. This is similar to what is shown in FIGS. 7 and 8. On the other hand, in FIGS. 9 and 10, the indium antimonide layer is disposed on a layered mesa structure 32 consisting of a silicon layer over a silicon dioxide layer. The silicon over silicon dioxide layered structure 32 is shown as a mesa. However, the silicon dioxide portion of Si/SiO$_2$ layer 32 could also be a thin blanket layer extending beyond mesa 32. However, the thin layer of silicon under the indium antimonide must be shaped as a mesa in order for the device to be improved. Electrical isolation from substrate 14 is provided by means of the insulating silicon/silicon oxide mesa layer 32. Silicon over silicon oxide layer 32 is a continuous S-shaped layer that contains portions 32*a*, 32*b*, 32*c* beneath indium antimonide mesa portions 10*a*, 10*b* and 10*c*. The silicon layer 32 also includes portion 32*d* under enlarged "shorting bar" 20*a* and portion 32*e* under the enlarged "shorting bar" 20*b*. Silicon oxide layer 32 provides electrical isolation and electric field reduction in the underlying silicon substrate 14. While not shown, the silicon oxide layer has a thin layer of single crystal silicon on it to seed the start of the single crystal indium antimonide that is epitaxially deposited on it. The single crystal silicon on the silicon oxide layer can be a typical silicon-on-insulator (SOI) type of substrate material, of the type that is commercially available. In such materials, the silicon oxide layer may be only 1 μm thick or less. However, that is sufficient thickness for this invention. SOI materials can be prepared by depositing polycrystalline silicon on the silicon oxide layer which covers all but the edges of a silicon substrate 14 and then zone crystallizing it from one edge. They can also be prepared by deeply implanting oxygen into single crystal silicon followed by thermal annealing, effective to form a sub-surface silicon oxide layer. In any event, there will be a thin single crystal layer between the indium antimonide layer and the silicon oxide layer, permitting one to grow indium antimonide of quality high enough to have appreciable mobility.

On the other hand, layer 32 could alternatively be of the single crystal silicon of the SOI material, and the substrate surface shown covered with the silicon oxide layer. This would include the substrate surface portions under layer 32. Such a material could also be formed from commercially available SOI wafers by merely photolithographically etching away the single crystal silicon surface to form trenches in the upper silicon layer or mesas as shown. Still further, mesa 32 could be of a compound semiconductor material, such as gallium arsenide, analogous to that described in connection with layer 12 in FIG. 1.

It is recognized that layer 32 could be a blanket layer that covers the entire surface of substrate 14, as in FIG. 1. If layer 32 consists of a silicon layer on top of a silicon oxide layer, its sheet resistance, or resistivity divided by thickness, becomes very large as the thickness of the undoped silicon layer becomes less than about one micron. On the other hand, if it is an "S" shaped mesa, a further electric field reduction technique can be used in combination with it. The additional field reduction technique is illustrated in connection with FIGS. 11 and 12.

Figure 11:
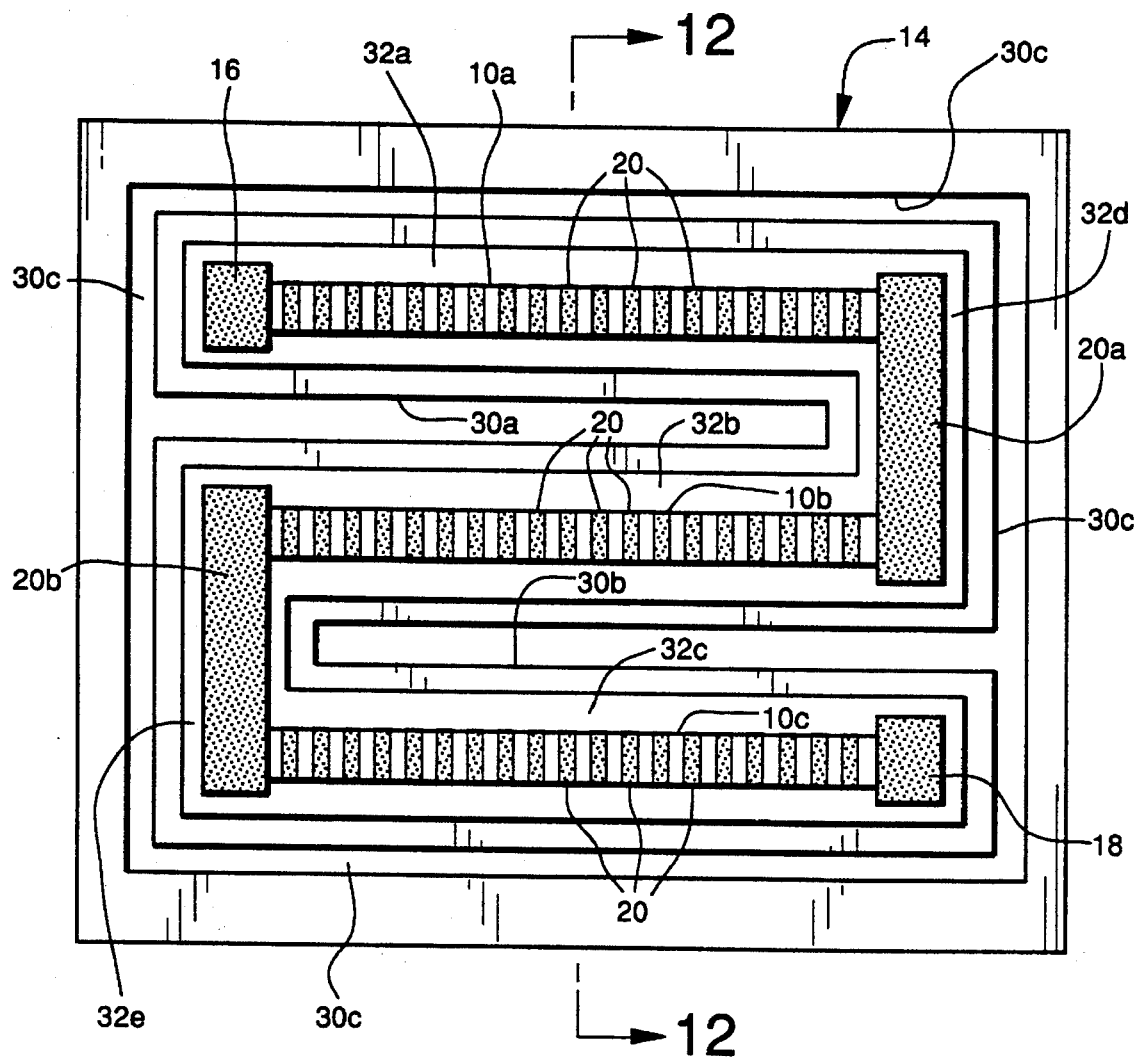
FIG. 11 shows a plan view of an integrated magnetoresistor sensor with both an encircling trench in the substrate and an intermediate layer in the form of a mesa.
Figure 12:
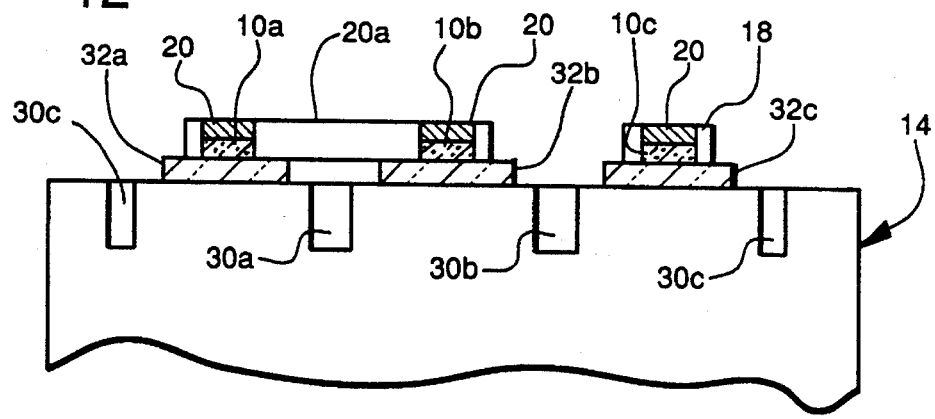
FIG. 12 shows a sectional view along the line 12—12 of FIG. 11.

FIGS. 11 and 12 show a structure similar to that shown in FIGS. 9 and 10, in which the intermediate epitaxial gallium arsenide layer 12 up to about 2 μm thick is disposed on a monocrystalline silicon substrate. However, in FIGS. 11 and 12, a substrate trench structure is also added that converts the substrate into a mesa structure, too. This trench structure is a further refinement of the trench structure shown in FIGS. 7 and 8. In FIGS. 11 and 12, the mesa 30 not only has trench-like portions 30a and 30b but also a completely enclosing perimeter trench 30c that interconnects with trench portions 30a and 30b. Accordingly, in FIGS. 11 and 12, the indium antimonide monocrystalline mesas 10a, 10b and 10c are disposed on the "S" shaped epitaxial gallium arsenide layer. The "S" shaped gallium arsenide layer is, in turn, disposed on an "S" shaped surface portion of the underlying silicon substrate 14. The "S" shaped single crystal silicon substrate surface is defined by the perimeter trench portion 32 and the staggered inwardly extending trench portions 30a and 30b. In the FIGS. 11 and 12 embodiment of the invention, the monocrystalline gallium arsenide layer provides a buffer layer that not only has a energy band gap higher than that of silicon but also has a lattice constant between that of silicon and indium antimonide. Hence, it serves as a very advantageous lattice buffer layer between the two. The higher energy band gap material reduces electrical fields in the silicon and also reduces parasitic conduction through the silicon between terminals 16 and 18.

In addition, the trench or moat structure of FIGS. 11 and 12 still further reduces electrical fields in the silicon between locations of significant voltage difference in the indium antimonide mesas. It also significantly increases electrical resistance through the silicon substrate between terminals 16 and 18, further reducing parasitic electrical conduction through the silicon. As previously indicated, reducing parasitic conduction in the silicon substrate increases magnetic sensitivity in the resultant magnetic field sensor.

One of the more important facets of the embodiment shown in FIGS. 11 and 12, as well as the embodiment shown in FIGS. 9 and 10, is that these embodiments of the invention can be made with a much finer geometry and a much closer spacing between terminals 16 and 18 than the other embodiments of this invention. Such a device can be made to have a higher spatial resolution of magnetic sensitivity or made to have a much greater total length of indium antimonide mesa in a given unit area. Such closer spacing means more serially connected individual magnetoresistor units per unit area of silicon wafer. This, of course, means higher total sensor resistance per unit area of substrate, or more sensors of the same resistance per unit area. The latter alternative provides manufacturing cost reduction. It is noted that, in all of the embodiments shown in all of the preceding figures, multiple magnetoresistors (two or more) may be integrated on the same substrate 14. These magnetoresistors may be independently connected at their respective terminals 16 and 18, or some of their terminals (e.g., 16) may be shorted together.

Indium antimonide has the zinc blende crystal structure, and silicon has the closely related diamond crystal structure. Accordingly, these materials are fundamentally similar in their crystal properties. However, as indicated in FIG. 13, silicon and indium antimonide have a significantly different crystal lattice constant.

FIG. 13 is a diagram showing the lattice constant and energy band gap of a variety of elemental and compound semiconductors. In FIG. 13, lattice constant is shown in angstroms at 300K as the abscissa. Energy band gap is shown in electron volts at 300K as the ordinate. Silicon has an energy band gap of 1.12 electron volts at 300K. Germanium has an energy band gap of 0.67 electron volts at 300K. Gallium arsenide has a larger energy band gap of 1.43 electron volts at 300K. Consequently, gallium arsenide has an intrinsic carrier density, $n_i$, of about $9 \times 10^6$ cm$^{-3}$ at 300K. While silicon has an intrinsic carrier density, $n_i$, of about $1.5 \times 10^{10}$ cm$^{-3}$, germanium's carrier density, $n_i$, is about $2.4 \times 10^{13}$ cm$^{-3}$ at 300K. It should also be recognized that while there is a significant difference in carrier density between gallium arsenide and germanium, they have a fairly close match in linear thermal expansion coefficient. Accordingly, where thermal cycling is especially severe, germanium may be preferred as a substrate material, but only if a high energy band gap compound semiconductor, such as indium phosphide or gallium arsenide, is interposed between the indium antimonide or indium arsenide active layer and the germanium substrate. Otherwise, the germanium layer can have a parasitic conductivity that partially or even completely masks conductivity changes in the indium antimonide layer due to magnetic influences.

The foregoing detailed description shows that the preferred embodiments of the present invention are well suited to fulfill the objects above stated. It is recognized that those skilled in the art may make various modifications or additions to the preferred embodiments chosen to illustrate the present invention without departing from the spirit and proper scope of the invention. For example, other mesa/trench configurations are clearly possible. Accordingly, it is to be understood that the protection sought, and to be afforded hereby, should be deemed to extend to the subject matter defined by the appended claims, including all fair equivalents thereof.

The embodiments of the invention in which an exclusive property or privilege is claimed are defined as follows:

1. An electronic apparatus that includes a magnetic field sensor of indium antimonide for applications having thermal cycling with wide temperature variation, said apparatus comprising:

a monocrystalline substrate of at least one substantially intrinsic elemental semiconductor selected from the class consisting of silicon and germanium, said semiconductor having a given energy band gap and said substrate having a substantially planar monocrystalline surface portion;

an epitaxial active layer about 1 to 5 μm thick of a compound semiconductor selected from the group consisting of indium antimonide and indium arsenide on the substrate surface portion, said compound semiconductor epitaxial layer being configured as an elongated mesa on said substrate surface portion and having an electron mobility of greater than about 15,000 cm²/V•s;

said layer being doped n-type such that it contains an excess density of electrons in said compound semiconductor epitaxial layer, said excess density relatively stabilizing majority carrier density from about −40° C. to about 200° C. without degrading said electron mobility to less than about 15,000 cm²/V•s;

at least two electrical conductors respectively contacting spaced portions of said elongated compound semiconductor epitaxial mesa layer for applying a voltage difference between said spaced portions, which voltage difference would form an associated electric field in said elemental semiconductor substrate; and field reduction means for limiting the maximum associated electrical field formed in said elemental semiconductor by said voltage difference to a value that does not exceed the dielectric strength of the elemental semiconductor, effective to provide a compound semiconductor magnetic field sensor on a lower cost substrate in said apparatus, which compound semiconductor magnetic field sensor substantially retains its original electron mobility after extensive thermal cycling, and thereby substantially retains its original magnetic sensitivity after such cycling.

2. The electronic apparatus as defined in claim 1 wherein the field reduction means includes at least one means selected from the group consisting of:

(a) an epitaxial layer up to about 2 μm thick, of a substantially intrinsic second compound semiconductor having an energy band gap higher than that of the elemental semiconductor, interposed between said active layer compound semiconductor and said elemental semiconductor substrate, (b) a mesa geometry parallel to said substrate surface that provides significant spacing between mesa portions of significant voltage difference, and (c) means for limiting voltage applied between said conductor contacts to less than a voltage which would produce a breakdown electrical field in said elemental semiconductor between any two points along said elongated mesa.

3. The electronic apparatus as defined in claim 2 wherein the active layer compound semiconductor is indium antimonide and the compound semiconductor is at least one member selected from the group consisting of gallium arsenide, gallium aluminum arsenide, indium aluminum antimonide and indium phosphide.

4. The electronic apparatus as defined in claim 3 wherein the gallium aluminum arsenide compound semiconductor is $Ga_xAl_{1-x}As$, where "x" is about 0.6.

5. The electronic apparatus as defined in claim 3 wherein the compound semiconductor layer is a graded through its thickness from gallium arsenide on one face to $Ga_xAl_{1-x}As$, where "x" is about 0.6, in its interior and back to gallium arsenide at the opposite face.

6. The electronic apparatus as defined in claim 5 wherein the interior portion of said compound semiconductor layer, that is $Ga_xAl_{1-x}As$ where "x" is about 0.6, has a thickness that is about 40% to 60% of the entire thickness of said compound semiconductor layer.

7. The electronic apparatus as defined in claim 2 wherein said geometry of said active layer compound semiconductor mesa layer parallel to said substrate surface includes at least two arm-connected v-shaped segments between said contacts.

8. The electronic apparatus as defined in claim 2 wherein the means for limiting voltage applied to said conductor contacts is at least one electrical component supported by said elemental semiconductor substrate in addition to the magnetic field sensor formed by said active layer.

9. The electronic apparatus as defined in claim 8 wherein the additional electrical component or components on said substrate is at least one member selected from the group consisting of a capacitor and a pair of series connected back-to-back zener diodes.

10. The electronic apparatus as defined in claim 8 wherein the additional electrical component is integrated with said elemental semiconductor substrate.

11. The electronic apparatus as defined in claim 2 wherein the means for limiting voltage applied to said conductor contacts is included in a voltage source which applies the voltage difference between said conductor contacts.

12. The electronic apparatus as defined in claim 1 wherein the magnetic field sensor is a magnetoresistor.

13. The electronic apparatus as defined in claim 2 wherein the magnetic field sensor is a magnetoresistor.

14. An indium antimonide magnetic field sensor that retains its high electron mobility, and attendant high magnetic sensitivity, after thermal cycling with wide temperature variation and that includes voltage protection, said magnetic field sensor comprising:

a monocrystalline substrate of at least one substantially intrinsic elemental semiconductor selected from the class consisting of silicon and germanium, said semiconductor having a given energy band gap and attendant intrinsic resistivity, and said substrate having a substantially planar monocrystalline surface portion;

a monocrystalline layer about 0.01 to 2.0 μm thick of a substantially intrinsic compound semiconductor on the elemental semiconductor substrate surface portion, said compound semiconductor having an energy band gap and attendant resistivity that is higher than that of silicon, and also having a crystal lattice constant between that of silicon and indium antimonide;

a monocrystalline layer about 1 to 3 μm thick of indium antimonide on the monocrystalline compound semiconductor layer, said monocrystalline indium antimonide layer being configured as an elongated mesa and having an electron mobility of greater than about 15,000 cm²/V•s;

an n-type doping of said indium antimonide layer generally stabilizing majority carrier density from about −40° C. to about 200° C. without significantly degrading said electron mobility and attendant sensitivity to applied magnetic fields;

terminal contacts on spaced portions of said elongated indium antimonide epitaxial layer for applying a voltage difference to said spaced portions, which voltage difference would form an associated electric field extending through said higher resistivity compound semiconductor layer into said elemental semiconductor substrate;

effective to provide an indium antimonide magnetic field sensing layer that retains high magnetic sensitivity even after extensive thermal cycling on a low cost substrate, with electric field absorbing means therebetween.

15. The magnetic field sensor as defined in claim 14 wherein the elemental semiconductor is silicon and the compound semiconductor is at least one member selected from the group consisting of gallium arsenide and gallium aluminum arsenide, indium aluminum antimonide and indium phosphide.

16. The magnetic field sensor as defined in claim 15 wherein the compound semiconductor layer is a graded through its thickness from gallium arsenide on one face to $Ga_xAl_{1-x}As$, where "x" is about 0.6, in its interior and back to gallium arsenide at the opposite face, with the interior of said compound semiconductor layer that is $Ga_xAl_{1-x}As$, where "x" is about 0.6, being of a thickness that is about 40% to 60% of the entire thickness of said compound semiconductor layer.

17. A high sensitivity indium antimonide magnetoresistor sensor for applications having thermal cycling and wide temperature variation and having a relatively stable high electron mobility after extensive thermal cycling, said indium antimonide magnetoresistor comprising:

a monocrystalline substrate of at least one intrinsic elemental semiconductor selected from the class consisting of silicon and germanium, said substrate having a substantially planar and monocrystalline surface portion;

an epitaxial layer about 1 to 3 μm thick of indium antimonide directly on said substrate surface portion, said indium antimonide epitaxial layer having an elongated mesa conformation on said substrate surface portion and having an areal electron mobility of greater than about 15,000 cm²/V•s;

an n-type doping of said indium antimonide epitaxial layer, said doping being at a concentration of about $0.3 \times 10^{17}$ cm$^{-3}$ to $3 \times 10^{17}$ cm$^{-3}$, and sufficient to relatively stabilize majority carrier density from about −40° C. to about 200° C. without degrading said electron mobility to less than about 15,000 cm²/V•s;

at least two electrical conductors respectively contacting spaced portions of said elongated indium antimonide epitaxial mesa layer for applying a voltage difference between said spaced portions, which voltage difference would form an associated electric field in said elemental semiconductor substrate; and field reduction means for limiting the maximum electrical field formed in said elemental semiconductor by said voltage difference to a value that does not exceed the dielectric strength of the elemental semiconductor, wherein the field reduction means includes a mesa geometry parallel to said substrate surface portion that provides significant spacing between mesa portions of significant voltage difference;

effective to provide an indium antimonide magnetic field sensor on a lower cost substrate, which indium antimonide magnetic field sensor substantially retains magnetic sensitivity after extensive thermal cycling and includes integral electric field protection.

18. The magnetoresistor sensor of claim 17 wherein the elemental semiconductor is silicon.

19. The magnetoresistor sensor as defined in claim 18 wherein said indium antimonide mesa geometry parallel to said substrate surface includes at least two arm-connected v-shaped segments between said contacts.

20. The magnetoresistor sensor as defined in claim 19 wherein the electric field reduction further includes integral electrical circuit component means for limiting voltage applied between said conductor contacts to less than a voltage which produces a breakdown electrical field in said elemental semiconductor between any two points along said elongated mesa.

* * * * *